United States Patent
Takahashi et al.

(10) Patent No.: US 8,527,225 B2
(45) Date of Patent: Sep. 3, 2013

(54) ESTIMATION APPARATUS AND ESTIMATION METHOD

(75) Inventors: Kenji Takahashi, Aichi (JP); Yuji Nishi, Aichi (JP); Tetsuya Fuchimoto, Aichi (JP)

(73) Assignee: Toyota Jidosha Kabushiki Kaisha, Aichi (JP)

(*) Notice: Subject to any disclaimer, the term of this patent is extended or adjusted under 35 U.S.C. 154(b) by 0 days.

(21) Appl. No.: 13/508,072

(22) PCT Filed: Oct. 5, 2010

(86) PCT No.: PCT/JP2010/005960
§ 371 (c)(1),
(2), (4) Date: May 4, 2012

(87) PCT Pub. No.: WO2012/046265
PCT Pub. Date: Apr. 12, 2012

(65) Prior Publication Data
US 2012/0221267 A1  Aug. 30, 2012

(51) Int. Cl.
*G01R 31/36* (2006.01)
(52) U.S. Cl.
USPC .......... 702/63; 702/64; 702/99; 702/104; 702/182; 702/189
(58) Field of Classification Search
USPC ....... 702/63–64, 99, 104, 182, 189; 324/429, 324/431; 320/128, 164
See application file for complete search history.

(56) References Cited

U.S. PATENT DOCUMENTS

| 5,808,445 A * | 9/1998 | Aylor et al. ............ 320/132 |
| 2010/0045240 A1 * | 2/2010 | Bergveld et al. .......... 320/132 |
| 2010/0085057 A1 | 4/2010 | Nishi et al. |

FOREIGN PATENT DOCUMENTS

| JP | 2008-243373 A | 10/2008 |
| JP | 2009-097878 A | 5/2009 |
| JP | 2010-060406 A | 3/2010 |

OTHER PUBLICATIONS

International Search Report of PCT/JP2010/005960 dated Jan. 11, 2011.

* cited by examiner

*Primary Examiner* — Sujoy Kundu
*Assistant Examiner* — Elias Desta
(74) *Attorney, Agent, or Firm* — Sughrue Mion, PLLC

(57) ABSTRACT

An estimation apparatus has a controller which estimates an internal reaction of a secondary battery. The controller calculates a voltage drop amount due to an internal resistance of the secondary battery by using an expression (I):

$$\Delta V = \frac{RT}{\alpha\beta F}\operatorname{arcsinh}\left(\frac{-R_r I}{\frac{RT}{\alpha\beta F}}\right) - R_d I \quad (\mathrm{I})$$

where $\Delta V$ represents the voltage drop amount, R represents a gas constant, T represents a temperature, $\alpha$ represents an oxidation reduction transfer coefficient ($\alpha=0.5$) of an electrode, $\beta$ represents a correction coefficient ($0<\beta<1$), F represents the Faraday constant, I represents a discharge current, $R_r$ represents a component of a reaction resistance included in the internal resistance, and $R_d$ represents a component of a direct-current resistance included in the internal resistance.

6 Claims, 14 Drawing Sheets

ESTIMATION APPARATUS AND ESTIMATION METHOD

CROSS REFERENCE TO RELATED APPLICATIONS

This application is a National Stage of International Application No. PCT/JP2010/005960 filed Oct. 5, 2010 the contents of all of which are incorporated herein by reference in their entirety.

TECHNICAL FIELD

The present invention relates to an apparatus and a method of estimating the internal reaction of a secondary battery.

BACKGROUND ART

There is a technology of representing a secondary battery as a simple model to estimate the internal state of the secondary battery. For example, in a technology described in Patent Document 1, the distribution of the concentration of a reactant is estimated by combining a simplified voltage-current relationship model expression with an active material diffusion model expression.

PRIOR ART DOCUMENTS

Patent Documents

[Patent Document 1] Japanese Patent Laid-Open No. 2008-243373
[Patent Document 2] Japanese Patent Laid-Open No. 2009-097878

DISCLOSURE OF THE INVENTION

Problems to be Solved by the Invention

The use of the simple battery model can reduce the computation load for estimating the internal state of the secondary battery. The adoption of the simple battery model may, however, reduce the estimation accuracy.

Means for Solving the Problems

An estimation apparatus according to a first aspect of the present invention has a controller which estimates the internal reaction of a secondary battery. The controller calculates a voltage drop amount due to an internal resistance of the secondary battery by using an expression (I):

$$\Delta V = \frac{RT}{\alpha \beta F} \operatorname{arcsinh}\left(\frac{-R_r I}{\frac{RT}{\alpha \beta F}}\right) - R_d I \quad \text{(I)}$$

where $\Delta V$ represents the voltage drop amount, R represents a gas constant, T represents a temperature, $\alpha$ represents an oxidation reduction transfer coefficient ($\alpha$=0.5) of an electrode, $\beta$ represents a correction coefficient (0<$\beta$<1), F represents the Faraday constant, I represents a discharge current, Rr represents a component of a reaction resistance included in the internal resistance, and Rd represents a component of a direct-current resistance included in the internal resistance.

The correction coefficient $\beta$ can be stored in a memory. The controller can calculate (estimate) the voltage drop amount by using the correction coefficient $\beta$ stored in the memory. As the correction coefficient $\beta$, 0.25 can be used.

A voltage sensor which detects the voltage of the secondary battery can be used to measure the voltage drop amount (actual measured value). The correction coefficient $\beta$ when the voltage drop amount (calculated value) calculated from the expression (I) is equal to the voltage drop amount (actual measured value) can be calculated. This can set the correction coefficient $\beta$ to be a value suitable for the actual secondary battery to improve the accuracy of the voltage drop amount (calculated value).

It is possible to use data indicating a correspondence between the correction coefficient $\beta$ and an interface state within the secondary battery to specify the interface state associated with the calculated correction coefficient $\beta$. This allows the estimation of the internal state of the secondary battery based on the correction coefficient $\beta$. For example, when the correction coefficient $\beta$ is changed, it can be seen that the internal state of the secondary battery is also changed. Specifically, it can be found that the deterioration of the secondary battery is proceeding.

According to a second aspect of the present invention, a method of estimating the internal reaction of a secondary battery includes calculating a voltage drop amount due to an internal resistance of the secondary battery by using an expression (II):

$$\Delta V = \frac{RT}{\alpha \beta F} \operatorname{arcsinh}\left(\frac{-R_r I}{\frac{RT}{\alpha \beta F}}\right) - R_d I \quad \text{(II)}$$

where $\Delta V$ represents the voltage drop amount, R represents a gas constant, T represents a temperature, $\alpha$ represents an oxidation reduction transfer coefficient ($\alpha$=0.5) of an electrode, $\beta$ represents a correction coefficient (0<$\beta$<1), F represents the Faraday constant, I represents a discharge current, Rr represents a component of a reaction resistance included in the internal resistance, and Rd represents a component of a direct-current resistance included in the internal resistance.

Effect of the Invention

According to the present invention, the computation load in estimating the voltage drop amount due to the internal resistance of the secondary battery can be reduced, and the estimation accuracy of the voltage drop amount can be improved. This can lead to improved estimation accuracy of SOC (State Of Charge).

MODE FOR CARRYING OUT THE INVENTION

Embodiments of the present invention will hereinafter be described.

Embodiment 1

Figure 1:
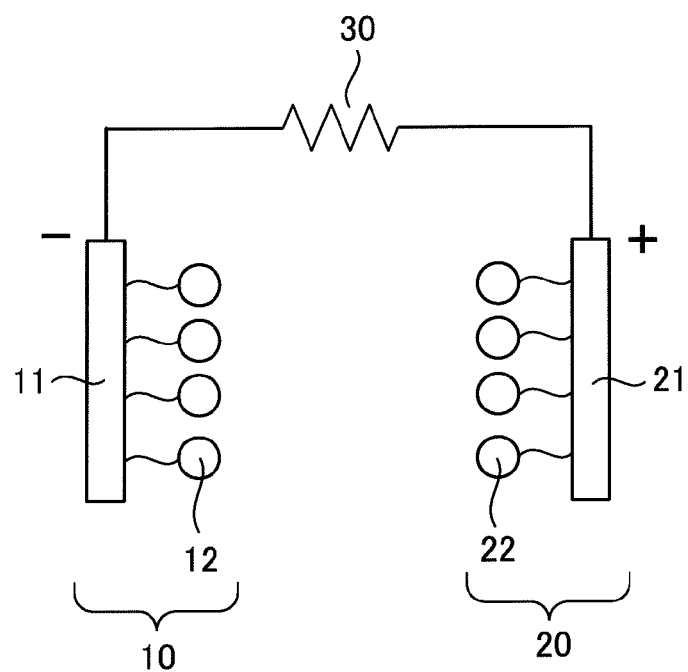
FIG. 1 is a diagram showing a model of a lithium-ion secondary battery.

FIG. 1 shows a model of a lithium-ion secondary battery. In FIG. 1, the lithium-ion secondary battery is connected to a load 30.

In FIG. 1, a negative electrode 10 is formed of a negative electrode collector plate 11 and a plurality of negative electrode active materials 12, and a positive electrode 20 is formed of a positive electrode collector plate 21 and a plurality of positive electrode active materials 22. In reality, the layers formed on the surfaces of the collector plates 11 and 21 include not only the active materials 12 and 22 but also a conductive agent, a binder and the like. A separator containing an electrolyte solution is placed between the negative electrode active materials 12 and the positive electrode active materials 22. It should be noted that a solid electrolyte may be used instead of the electrolyte solution.

Description is now made of a chemical reaction when the lithium-ion secondary battery is discharged. An electrode reaction on the surfaces of the negative electrode active materials 12 causes lithium atoms Li in the negative electrode active materials 12 to eject electrons e− and the resulting lithium ions Li+ are ejected into the electrolyte solution within the separator. An electrode reaction on the surfaces of the positive electrode active materials 22 causes the lithium ions Li+ in the electrolyte solution to be taken thereinto and absorb the electrons e−. Thus, the lithium atoms Li are taken into the positive electrode active materials 22.

The ejection of the lithium ions Li+ from the negative electrode active materials 12 and the taking of the lithium ions Li+ into the positive electrode active materials 22 allow an electric current to flow from the positive electrode collector plate 11 toward the negative electrode collector plate 21. For charging the lithium-ion secondary battery, an electrode reaction on the surfaces of the negative electrode active materials 12 causes the lithium ions Li+ in the electrolyte solution to be taken thereinto and an electrode reaction on the surfaces of the positive electrode active materials 22 causes the lithium ions Li+ to be ejected into the electrolyte solution.

Relating to the insertion/elimination of Li at the interface between each of the active materials 12 and 22 and the electrolyte solution, the Butler-Volmer equation is represented as the following expression (1). The direction in which Li is eliminated from the active material is assumed to be positive.

$$j_j^{Li} = a_{sj} i_{0j} \cdot \left[ \exp\left(\frac{\alpha_{aj} F}{RT} \cdot \eta_j\right) - \exp\left(-\frac{\alpha_{cj} F}{RT} \cdot \eta_j\right) \right] \quad (1)$$

The definitions of variables used in the expression (1) are shown in Table 1.

TABLE 1

| Variables | Name of variables | Unit |
| --- | --- | --- |
| R | gas constant | J/° C./mol |
| F | Faraday constant | C./mol |
| T | temperature | K |
| $\alpha_{aj}$ (j = 1: positive electrode, j = 2: negative electrode) | electrode oxidation transfer coefficient | — |
| $\alpha_{cj}$ (j = 1: positive electrode, j = 2: negative electrode) | electrode reduction transfer coefficient | — |
| $a_{sj}$ (j = 1: positive electrode, j = 2: negative electrode) | specific surface area of electrode active material | cm$^2$/cm$^3$ |
| $i_{0j}$ (j = 1: positive electrode, j = 2: negative electrode) | exchange current density of electrode | A/cm$^2$ |
| $\eta_j$ (j = 1: positive electrode, j = 2: negative electrode) | electrode overvoltage | V |
| $j_j^{Li}$ (j = 1: positive electrode, j = 2: negative electrode) | current density per volume of electrode | A/cm$^3$ |

Figure 2:
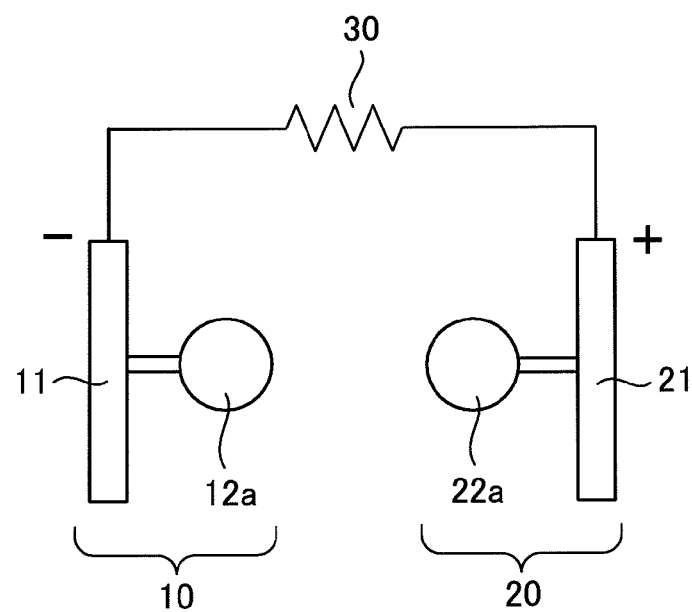
FIG. 2 is a diagram showing a battery model represented by two active materials (positive electrode active material and negative electrode active material).

Assuming that the active materials 12 and 22 react uniformly, the lithium-ion secondary battery is represented by a model in FIG. 2. In FIG. 2, the positive electrode and the negative electrode are represented by using single active materials 12a and 22a, respectively.

When the expression (1) is integrated in a thickness direction x of the electrode, the relational expression of the current density per unit electrode area and the electrode overvoltage can be obtained as shown in the following expression (2):

$$I_j = \int_0^{L_j} j_j^{Li} dx \quad (2)$$

$$= L_j j_j^{Li}$$

$$= L_j a_{sj} i_{0j} \cdot \left[ \exp\left(\frac{\alpha_{aj} F}{RT} \cdot \eta_j\right) - \exp\left(-\frac{\alpha_{aj} F}{RT} \cdot \eta_j\right) \right]$$

The definitions of variables used in the expression (2) are shown in Table 2.

TABLE 2

| Variables | Name of variables | Unit |
| --- | --- | --- |
| $L_j$ (j = 1: positive electrode, j = 2: negative electrode) | thickness of unit electrode | cm |
| $I_j = -I/S$ (j = 1: positive electrode) = I/S (j = 2: negative electrode) | current density per unit electrode area | A/cm$^2$ |
| I | discharge current | A |
| S | area of opposite portion of electrode | cm$^2$ |

In the lithium-ion secondary battery, the following expression (3) holds generally:

$$\alpha_{aj} = \alpha_{cj} = 0.5 \equiv \alpha \quad (3)$$

When the expression (3) is substituted into the expression (2), the following expression (4) is given:

$$I_j = L_j a_{sj} i_{0j} \cdot \left[ \exp\left(\frac{\alpha F}{RT} \cdot \eta_j\right) - \exp\left(-\frac{\alpha F}{RT} \cdot \eta_j\right) \right] \quad (4)$$
$$= 2 L_j a_{sj} i_{0j} \cdot \sinh\left(\frac{\alpha F}{RT} \cdot \eta_j\right)$$

When the expression (4) is inversely transformed, the following expression (5) is given:

$$\eta_j = \frac{RT}{\alpha F} \text{arcsinh}\left(\frac{I_j}{2 L_j a_{sj} i_{0j}}\right) \quad (5)$$

A reaction resistance of the lithium-ion secondary battery can be represented by the following expression (6):

$$R_{rj} = \frac{\eta_j}{I_j} = \frac{RT}{\alpha F} \frac{1}{2 L_j a_{sj} i_{0j}} \quad (6)$$

where $R_{rj}$ represents the reaction resistance per electrode area (in the unit [$\Omega cm^2$]), "j=1" represents the positive electrode, and "j=2" represents the negative electrode.

The internal resistance of the lithium-ion secondary battery includes a direct-current resistance and the reaction resistance. The direct-current resistance refers to a resistance component associated with the conduction of electrons and ions. The reaction resistance refers to a resistance component associated with the insertion and elimination of the Li ions into and from the active materials. When the current value and the voltage value of the lithium-ion secondary battery are measured, the resistance provided by the measurement results includes the direct-current resistance and the reaction resistance.

The direct-current resistance and the reaction resistance can be separated from each other by performing alternating-current impedance measurement. That is, the direct-current resistance and the reaction resistance can be provided individually. The alternating-current impedance measurement involves inputting an alternating current (or an alternating voltage) of small amplitude to the battery (on the condition that the current and the voltage have a linear relationship) and calculating the impedance from the phase lag and the amplitude ratio of the voltage response (or the current response). The impedance is measured while the frequency sweep is performed, thereby making it possible to obtain the direct-current resistance and the reaction resistance individually.

Since the reaction resistance obtained from the alternating-current impedance measurement can be linearized with the very small current, the expression (6) holds. When the expression (6) is transformed, the following expression (7) is given:

$$i_{0j} = \frac{RT}{\alpha F} \frac{1}{2 L_j a_{sj} R_{rj}} \quad (7)$$

According to the expression (7), it can be seen that the exchange current density in the positive electrode and the negative electrode and the reciprocal of the reaction resistance of the electrode have a proportional relationship.

When the expression (7) is substituted into the expression (5), the following expression (8) is given:

$$\eta_j = \frac{RT}{\alpha F} \text{arcsinh}\left(\frac{I_j}{2 L_j a_{sj} \frac{RT}{\alpha F} \frac{1}{2 L_j a_{sj} R_{rj}}}\right) \quad (8)$$
$$= \frac{RT}{\alpha F} \text{arcsinh}\left(\frac{R_{rj} I_j}{\frac{RT}{\alpha F}}\right)$$

As shown in the expression (8), it can be seen that the current and the electrode overvoltage have a non-linear relationship.

Figure 3:
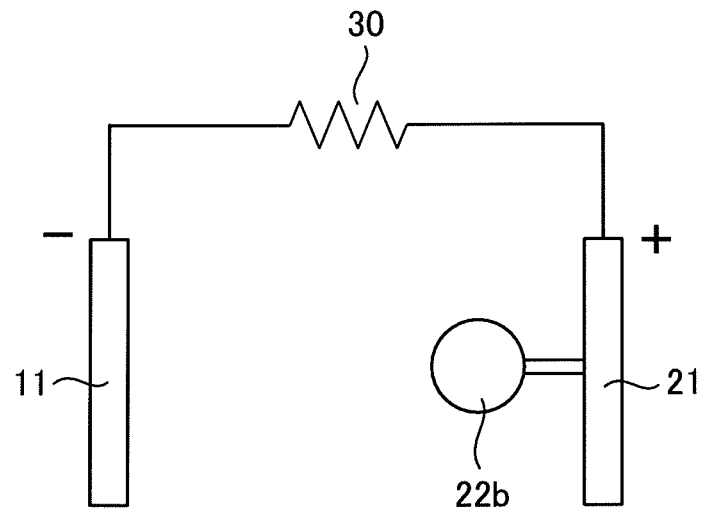
FIG. 3 is a diagram showing a battery model represented by a single active material (positive electrode active material).

The battery model shown in FIG. 2 can be simplified to a battery model shown in FIG. 3. In the battery model shown in FIG. 3, the active materials in the positive electrode and the negative electrode are integrated, and only the resulting single active material (the positive electrode active material) 22b is illustrated. In the battery model shown in FIG. 3, only one interface is present between the active material and the electrolyte solution.

Figure 4:
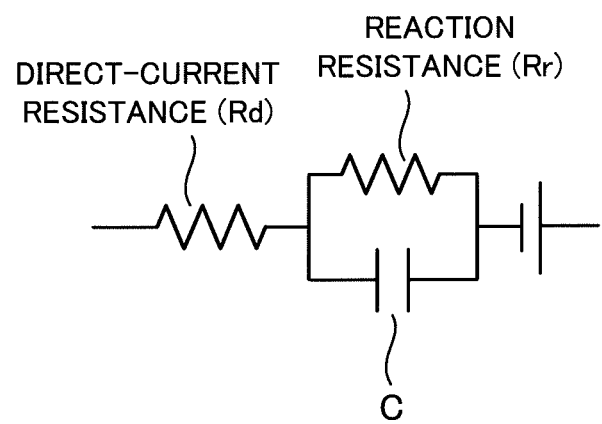
FIG. 4 is a diagram showing an equivalent circuit of the battery model shown in FIG. 3.

The battery model shown in FIG. 3 can be represented as an equivalent circuit shown in FIG. 4. The equivalent circuit shown in FIG. 4 is represented by a direct-current resistance Rd and a reaction resistance Rr provided from the alternating-current impedance measurement. A capacitance C connected in parallel to the reaction resistance Rr represents the capacitance of an electric double layer at the interface between the active material and the electrolyte solution or the like.

In the battery model shown in FIG. 3, the following expression (9) holds:

$$R_{r1} = R_r S$$
$$R_{r2} = 0 \quad (9)$$

According to the expression (9) and the expression (8), the following expression (10) is given:

$$\eta_1 = \frac{RT}{\alpha F} \text{arcsinh}\left(\frac{-R_r I}{\frac{RT}{\alpha F}}\right) \quad (10)$$
$$\eta_2 = 0$$

The change amount of the voltage is represented by the sum of the overvoltage in the positive electrode and the negative electrode and the IR relating to the direct-current resistance and is shown in the following expression (11). The change amount $\Delta V$ of the voltage corresponds to the difference (voltage drop amount) between the open circuit voltage (OCV) and the actual battery voltage.

$$\Delta V = \eta_1 - \eta_2 - R_d I \quad (11)$$
$$= \frac{RT}{\alpha F} \text{arcsinh}\left(\frac{-R_r I}{\frac{RT}{\alpha F}}\right) - R_d I$$

When the lithium-ion secondary battery is at room temperature (for example, at 0° C. or higher), the direct-current resistance Rd is predominant over the reaction resistance Rr. Thus, according to the expression (11), the IV behavior which represents the relationship between the voltage drop amount ΔV and the current exhibits linearity. On the other hand, when the lithium-ion secondary battery is at low temperature (for example, at a temperature lower than 0° C.), the reaction resistance Rr is predominant over the direct-current resistance Rd. Thus, according to the expression (11), the IV behavior exhibits non-linearity.

In the battery model shown in FIG. 3, the voltage drop amount ΔV can be calculated by using the expression (11). When the lithium-ion secondary battery is at low temperature, the calculated value (IV behavior) based on the expression (11) deviates from the actual measured value (IV behavior). Although the use of the expression (11) can reduce the computation load in calculating the voltage drop amount ΔV, the calculated value deviates from the actual measured value and the accuracy is reduced.

Figure 5:
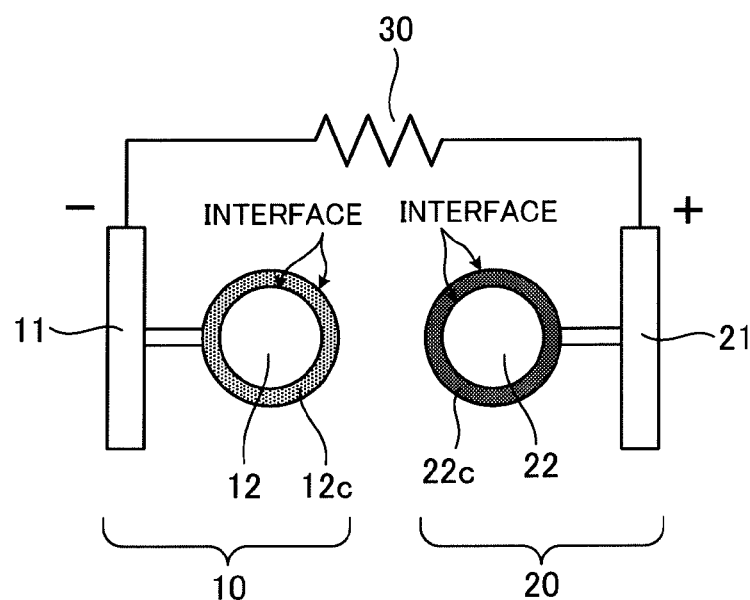
FIG. 5 is a diagram showing a battery model in which a coating is formed on each of two active materials.

On the other hand, the lithium-ion secondary battery can be considered with a model shown in FIG. 5. In the battery model shown in FIG. 5, two interfaces are present in the negative electrode 10 and two interfaces are present in the positive electrode 20. Specifically, in the negative electrode 10, a coating 12c is formed on the surface of the negative electrode active material 12. One interface is present between the negative electrode active material 12 and the coating 12c, and one interface is present between the coating 12c and the electrolyte solution. In the positive electrode 20, a coating 22c is formed on the surface of the positive electrode active material 22. One interface is present between the positive electrode active material 22 and the coating 22c, and one interface is present between the coating 22c and the electrolyte solution.

Figure 6:
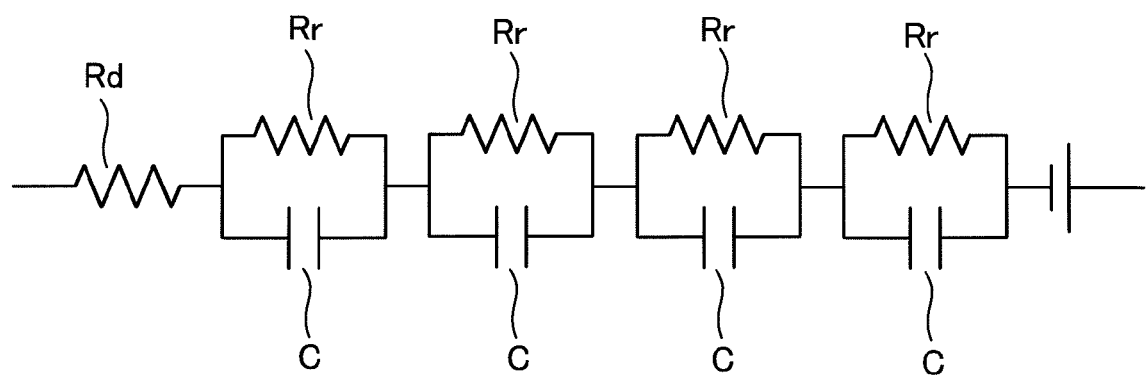
FIG. 6 is a diagram showing an equivalent circuit of the battery model shown in FIG. 5.

The battery model shown in FIG. 5 can be represented as an equivalent circuit shown in FIG. 6. The battery model in FIG. 5 can be represented by a single direct-current resistance Rd and four reaction resistances Rr. Since the four interfaces are present in the battery model shown in FIG. 5, they can be represented by the four reaction resistances Rr. Capacitances C connected in parallel to the reaction resistances Rr are the capacitances of electric double layers at the interfaces between the active materials 12 and 22 and the coatings 12c and 22c, respectively, and at the interfaces between the coatings 12c and 22c and the electrolyte solution, respectively.

Assuming that the reaction resistances at the four interfaces are equal, the following expression (12) is given:

$$R_{r1} = R_{r2} = \frac{R_r S}{4} \tag{12}$$

From the expression (12) and the expression (8), the voltage drop amount ΔV is represented by the following expression (13):

$$\Delta V = \eta_1 - \eta_2 - R_d I \tag{13}$$

$$= \frac{RT}{\alpha F} \mathrm{arcsinh}\left(\frac{-\frac{R_r I}{4}}{\frac{RT}{\alpha F}}\right) - \frac{RT}{\alpha F} \mathrm{arcsinh}\left(\frac{\frac{R_r I}{4}}{\frac{RT}{\alpha F}}\right) - R_d I$$

$$= 4\frac{RT}{\alpha F} \mathrm{arcsinh}\left(\frac{-\frac{R_r I}{4}}{\frac{RT}{\alpha F}}\right) - R_d I$$

The expression (13) can be represented by the following expression (14):

$$\Delta V = \frac{RT}{\alpha \beta F} \mathrm{arcsinh}\left(\frac{-R_r I}{\frac{RT}{\alpha \beta F}}\right) - R_d I \tag{14}$$

When a correction coefficient β is 0.25 in the expression (14), the expression (13) holds. When the correction coefficient β is 1, the expression (11) holds. The correction coefficient β is the reciprocal of the number of the interfaces.

Figure 16:
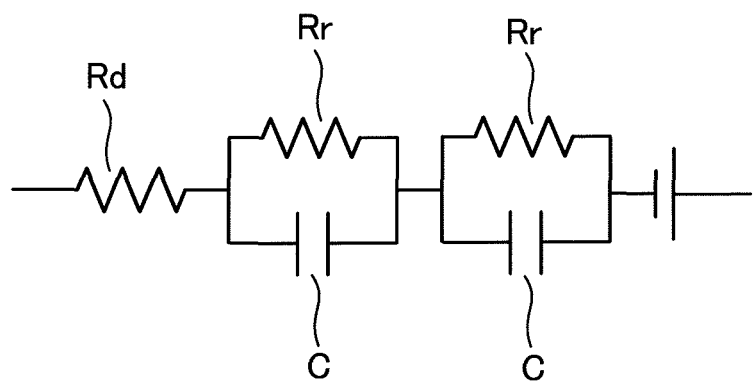
FIG. 16 is a diagram showing an equivalent circuit of the battery model ($\beta$=0.5).

FIG. 7 to FIG. 15 show the relationship between the actual measured values and the calculated values based on the expression (13). In FIG. 7 to FIG. 15, the vertical axis represents the voltage drop amount ΔV and the horizontal axis represents the current value. It should be noted that the charge current is set to a positive value. FIG. 7 to FIG. 15 also show the calculated values when the correction coefficient β is 1 and 0.5. In the battery model shown in FIG. 2, the two interfaces are present and the correction coefficient β is 0.5. FIG. 16 illustrates an equivalent circuit of the battery model shown in FIG. 2. The battery model in FIG. 2 can be represented by a single direct-current resistance Rd and two reaction resistances Rr.

As the actual measured values, the voltage change amount was measured after the lapse of a predetermined time period (for example, two seconds) from the start of the passage of current through the lithium-ion secondary battery. Such measurement can eliminate the influences of the voltage drop due to the distribution of the lithium concentration and the change of the open circuit voltage (OCV). In other words, only the influence of the direct-current resistance and the reaction resistance can be taken into account as the influence upon the voltage drop amount ΔV. When the voltage change amount is measured while the current value is changed, the IV behavior (actual measured value) can be obtained. On the other hand, the reaction resistance Rr and the direct-current resistance Rd are measured by using the alternating-current impedance measurement, so that the voltage drop amount (calculated value) ΔV can be calculated on the basis of the expression (14).

Figure 7:
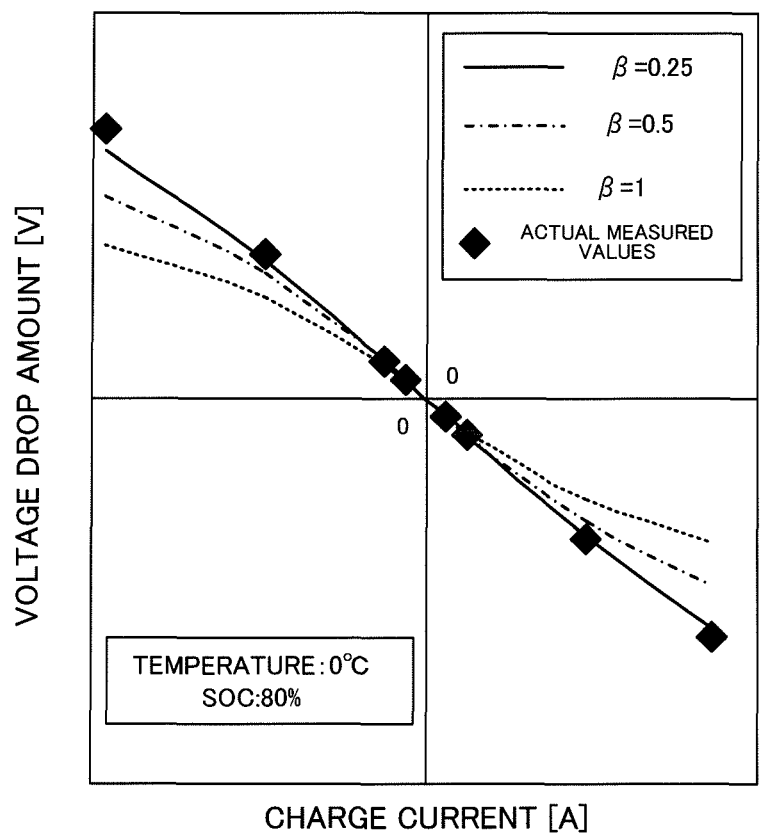
FIG. 7 is a graph showing a relationship between current values and voltage drop amounts.
Figure 8:
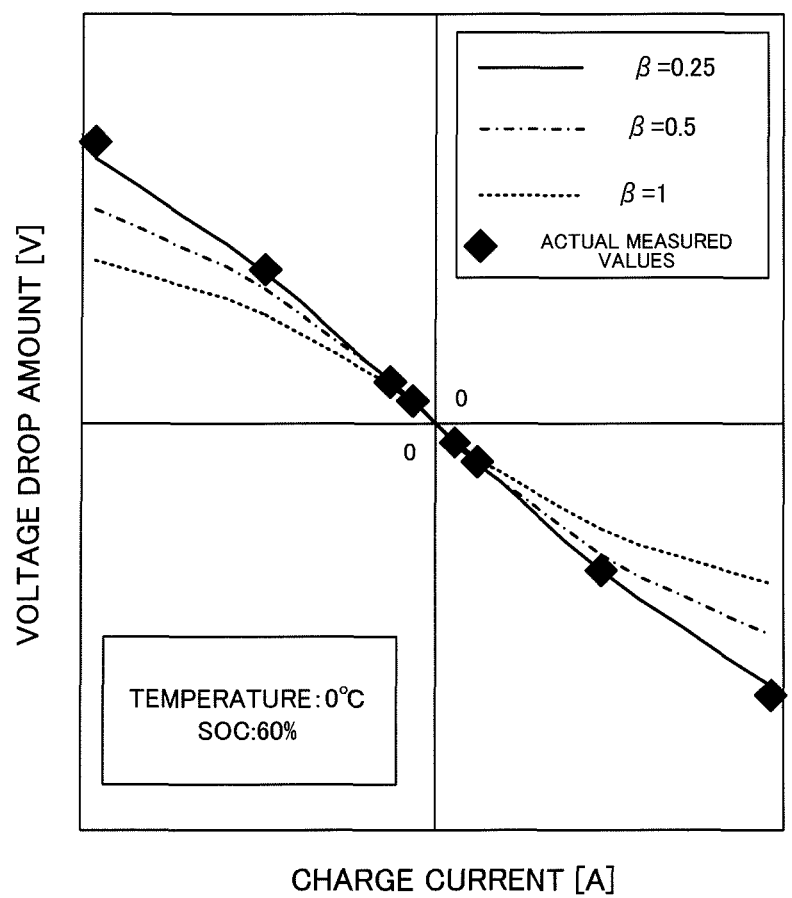
FIG. 8 is a graph showing a relationship between current values and voltage drop amounts.
Figure 9:
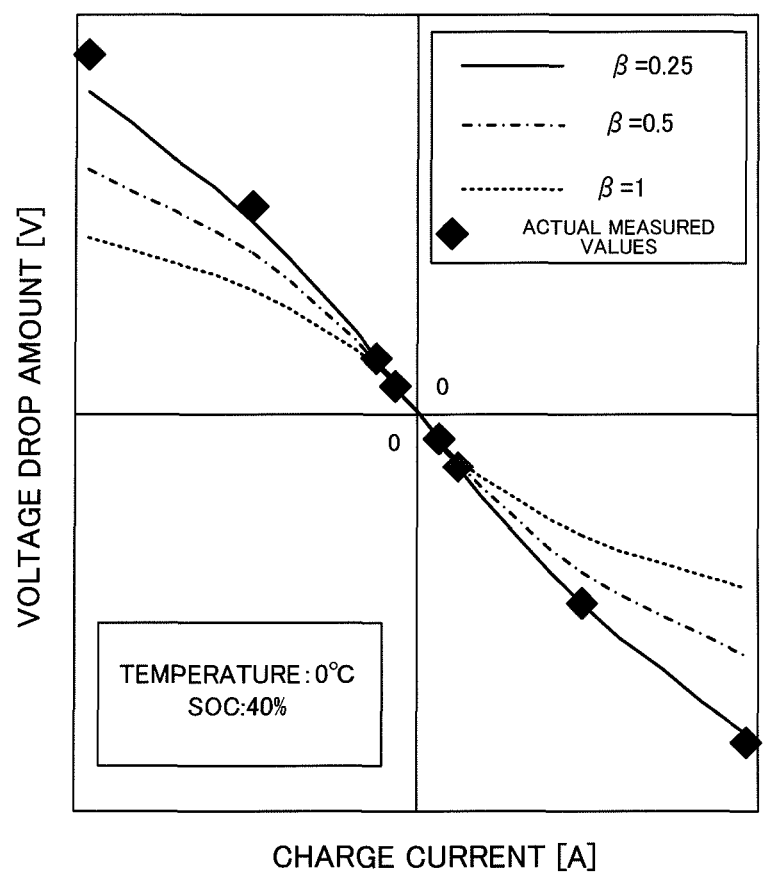
FIG. 9 is a graph showing a relationship between current values and voltage drop amounts.
Figure 10:
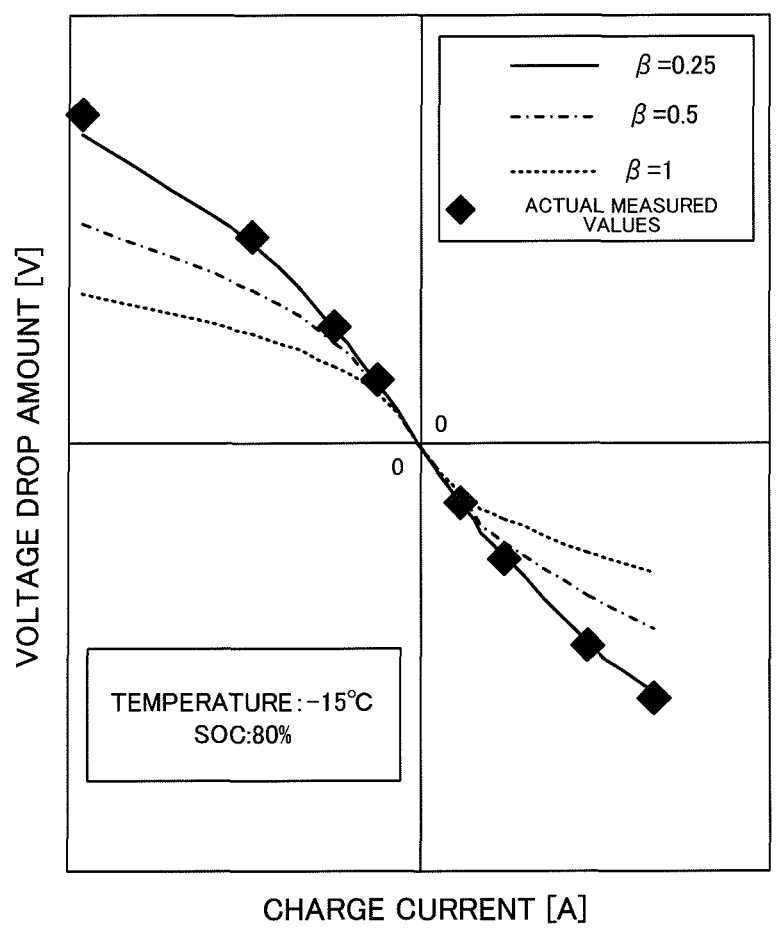
FIG. 10 is a graph showing a relationship between current values and voltage drop amounts.
Figure 11:
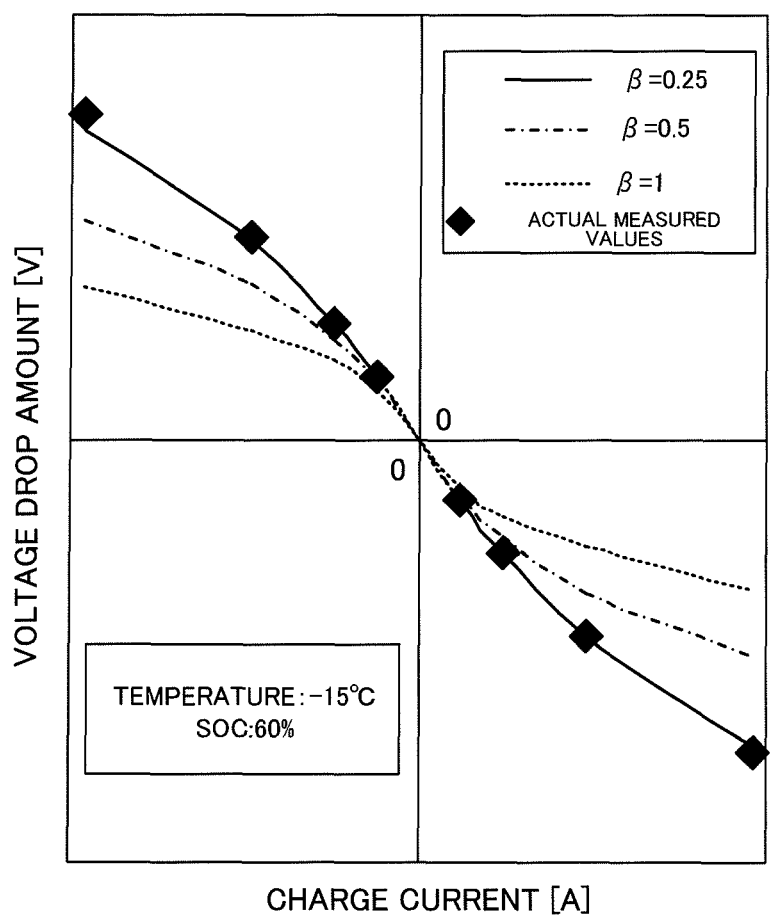
FIG. 11 is a graph showing a relationship between current values and voltage drop amounts.
Figure 12:
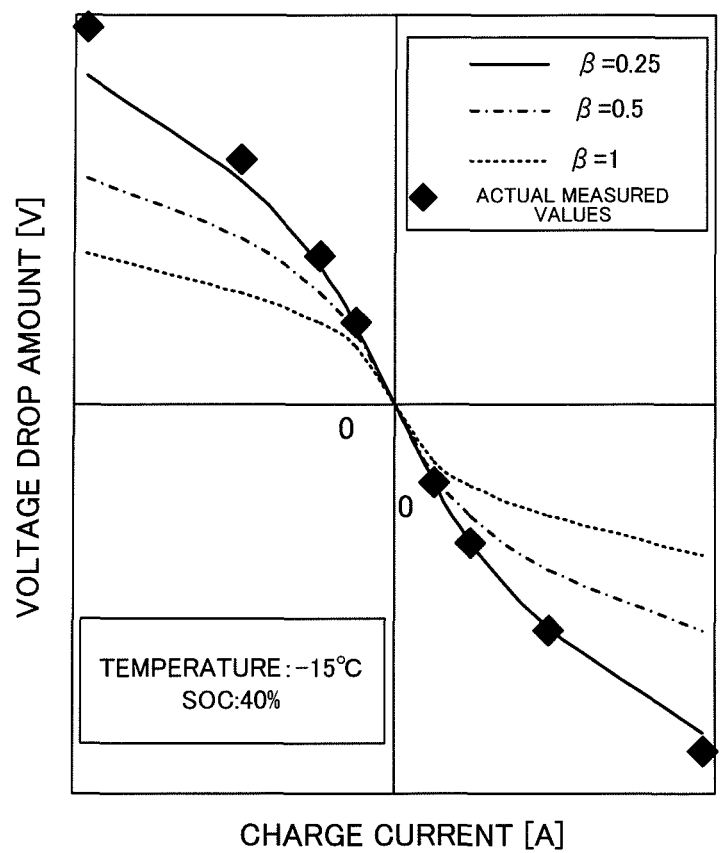
FIG. 12 is a graph showing a relationship between current values and voltage drop amounts.
Figure 13:
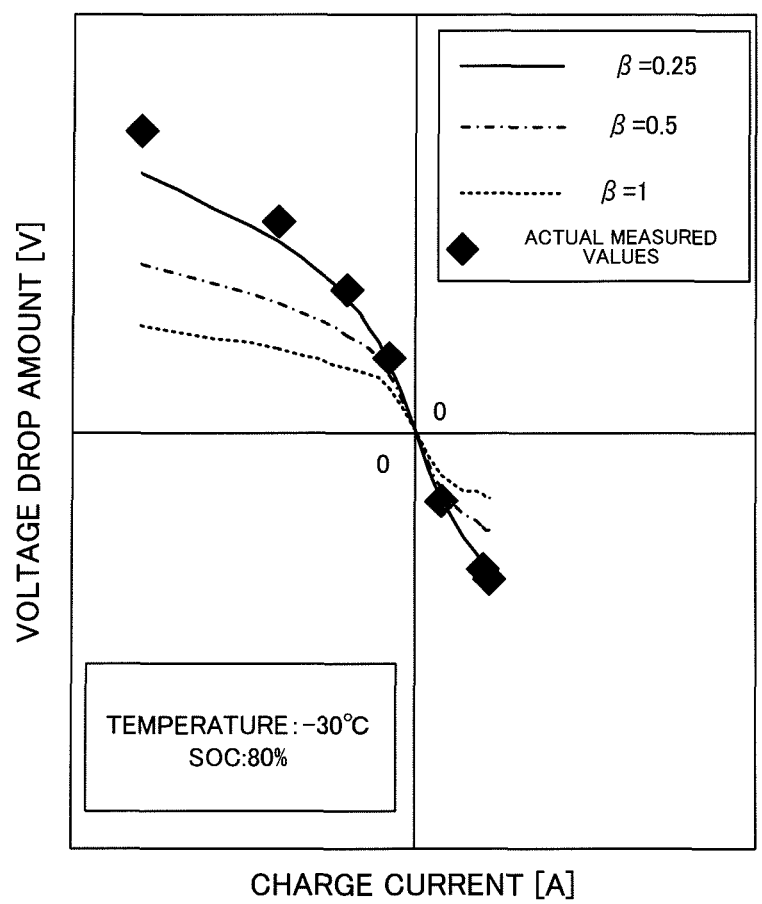
FIG. 13 is a graph showing a relationship between current values and voltage drop amounts.
Figure 14:
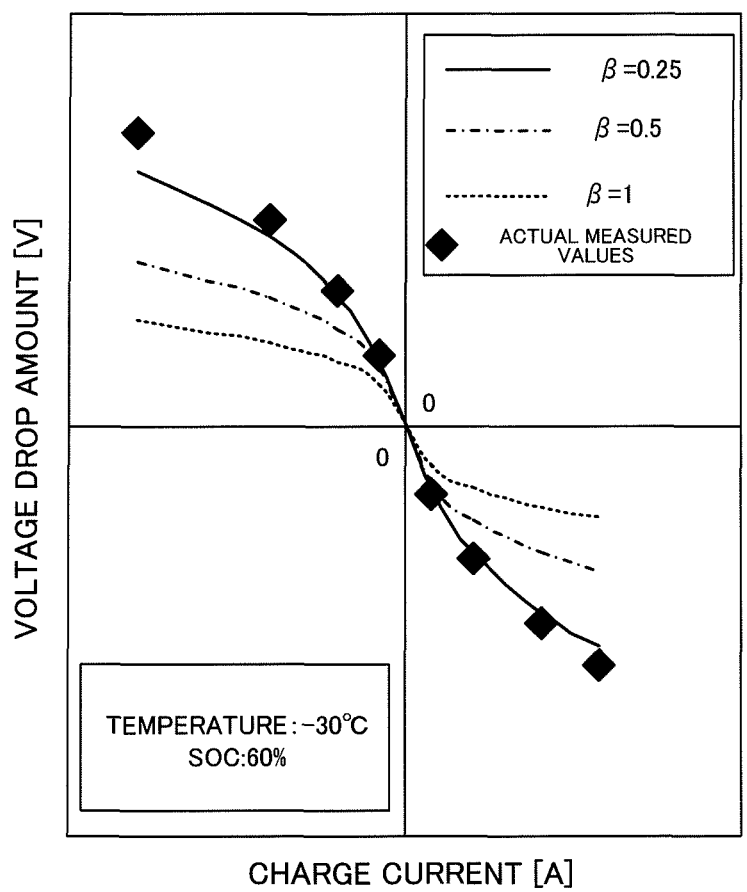
FIG. 14 is a graph showing a relationship between current values and voltage drop amounts.
Figure 15:
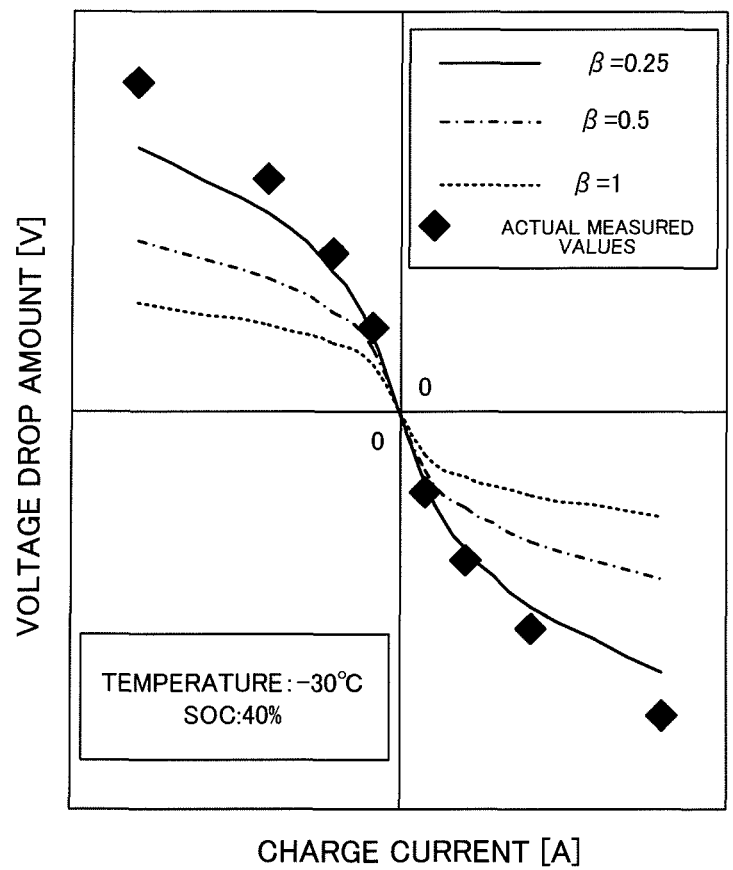
FIG. 15 is a graph showing a relationship between current values and voltage drop amounts.

In FIG. 7 to FIG. 9, the battery temperature is 0° C., and SOC (State of Charge) is set to 80, 60, and 40%, respectively. In FIG. 10 to FIG. 12, the battery temperature is −15° C., and SOC is set to 80, 60, and 40%, respectively. In FIG. 13 to FIG. 16, the battery temperature is −30° C., and SOC is set to 80, 60, and 40%, respectively.

As shown from FIG. 7 to FIG. 15, the calculated values when the correction coefficient β is 0.25 are consistent with the actual measured values. On the other hand, it can be seen that the calculated values when the correction coefficient β is 1 and 0.5 deviate from the actual measured values. It can also be seen that, when the correction coefficient β is 1 or 0.5, the calculated values deviate from the actual measured values more significantly as the battery temperature is lower.

The expression (13) can be represented in a similar form to that of the expression (11), the load in calculating the voltage drop amount ΔV is not changed. The calculated values of the voltage drop amount ΔV can be matched to the actual measured values to improve the estimation accuracy of the voltage drop amount ΔV.

While the calculated values when the correction coefficient β is 0.25 are consistent with the actual measured values in the experiment results shown in FIG. 7 to FIG. 15, the correction coefficient β is not necessarily 0.25. In other words, the correction coefficient β may deviate from 0.25 depending on the type of the lithium-ion secondary battery.

The present invention is characterized in that the voltage drop amount ΔV is calculated by using the expression (14). Specifically, only the definition of the correction coefficient β is required to allow the improved accuracy of the calculated values while maintaining the computation load associated with the battery model shown in FIG. 3. It should be noted that the correction coefficient β satisfies the condition in the following expression (15):

$$0 < \beta < 1 \qquad (15)$$

When the voltage drop amount ΔV can be estimated, the open circuit voltage (OCV) can be estimated on the basis of the following expression (16). A voltage value V is the voltage value of the lithium-ion secondary battery detected by a voltage sensor.

$$V = OCV + \Delta V \qquad (16)$$

Once the open circuit voltage (OCV) of the lithium-ion secondary battery can be estimated, the SOC of the lithium-ion secondary battery can be estimated. When the relationship between the open circuit voltage and the SOC is previously determined, the SOC can be estimated by using the estimated open circuit voltage (OCV). Since the estimation accuracy of the voltage drop amount ΔV can be improved, the estimation accuracy of the SOC can be improved. Especially, the estimation accuracy of the SOC can be improved when the lithium-ion secondary battery is at low temperature.

Embodiment 2

Figure 17:
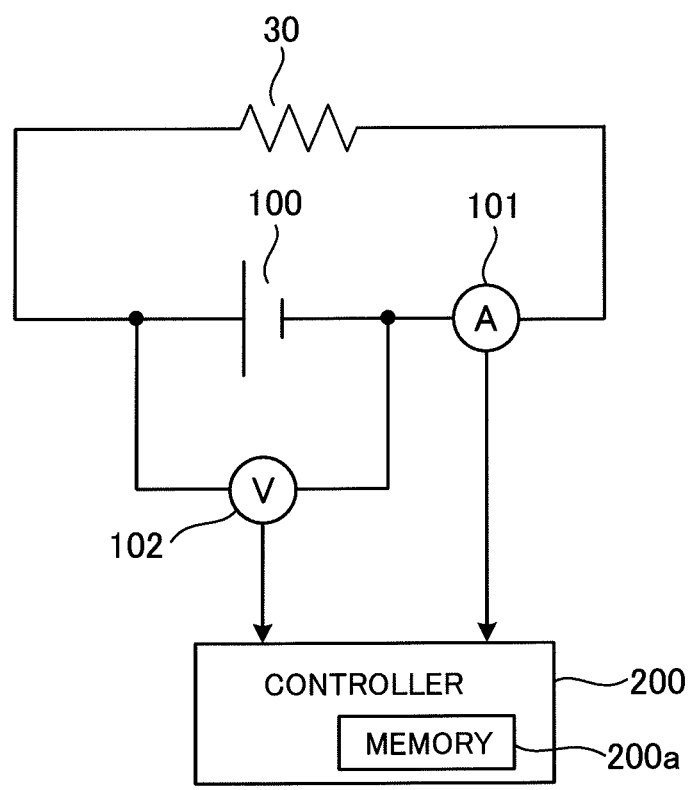
FIG. 17 is a schematic diagram showing a circuit configuration for calculating a correction coefficient $\beta$ in Embodiment 2.

In the present embodiment, the correction coefficient β is calculated on the basis of a lithium-ion secondary battery 100. First, the circuit configuration for calculating the correction coefficient β will be described with reference to FIG. 17.

A cell 100 is connected to a load 30. A current sensor 101 detects a current passing through the cell 10 and outputs the detection result to a controller 200. A voltage sensor 102 detects a voltage between terminals of the cell 10 and outputs the detection result to the controller 200. The controller 200 uses the detection results from the current sensor 101 and the voltage sensor 102 to calculate the correction coefficient β used in the cell 100.

Information about the correction coefficient β is stored in a memory 200a contained in the controller 200. The information about the correction coefficient β refers to information for specifying the correction coefficient β and includes information which directly represents the correction coefficient β or information which indirectly represents the correction coefficient β. The controller 200 can use the correction coefficient β stored in the memory 200a to estimate the voltage drop amount ΔV. While the memory 200a is contained in the controller 200 in the configuration shown in FIG. 17, the memory 200a may be provided in the outside of the controller 200.

Figure 18:
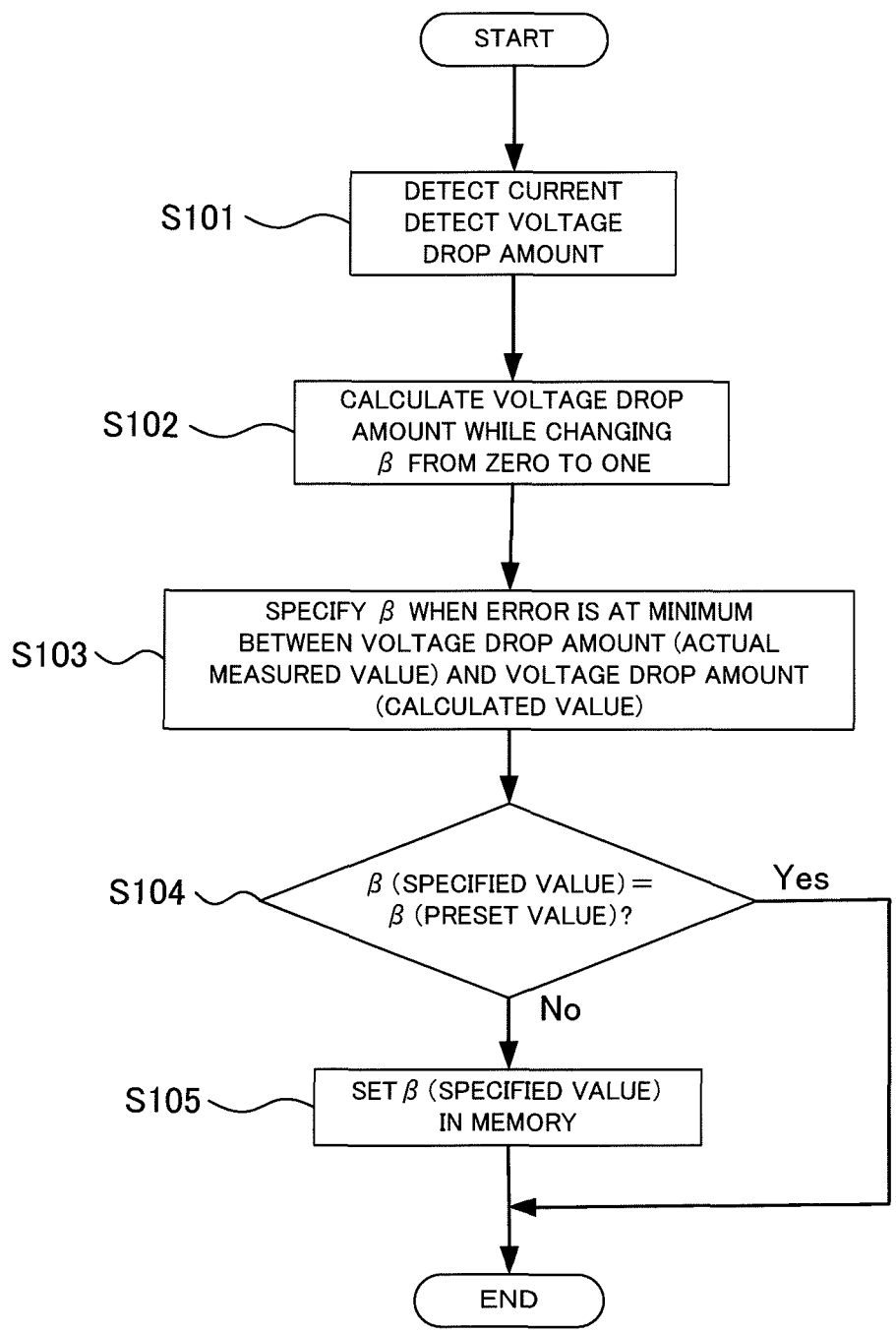
FIG. 18 is a flow chart showing the processing of calculating the correction coefficient $\beta$ in Embodiment 2.

The processing of calculating the correction coefficient β will be described with reference to a flow chart of FIG. 18. The processing in FIG. 18 is performed by the controller 200.

At step S101, while the cell 100 connected to the load 30 is discharged, the controller 200 obtains the current value based on the output from the current sensor 101 and obtains the voltage drop amount based on the output from the voltage sensor 102. This can provide the IV behavior (actually measured values) of the cell 100.

A map which shows the IV behavior can be obtained for each temperature and can be obtained for each SOC of the cell 100. Specifically, the IV behavior (actual measured values) can be measured while the temperature of the cell 100 is changed, and the IV behavior (actual measured values) can be measured while the SOC of the cell 100 is changed.

At step S102, the controller 200 calculates the voltage drop amount ΔV while changing the correction coefficient β between zero and one in the expression (14). The reaction resistance Rr and the direct-current resistance Rd in the expression (14) can be obtained through the alternating-current impedance measurement. The change amount of the correction coefficient β can be set as appropriate. For example, while the correction coefficient β is changed by 0.05 within the range from zero to one, the voltage drop amount ΔV can be calculated. The current value in the measurement of the IV behavior (actual measured value) at step S101 is used as the current I in the expression (14).

At step S103, the controller 200 calculates the error between the voltage drop amount (actual measured value) ΔV obtained at step S101 and the voltage drop amount (calculated value) ΔV calculated at step S102. Then, the controller 200 specifies the correction coefficient β when the error between the voltage drop amounts ΔV is at minimum. When the voltage drop amount (actual measured value) is measured while the temperature or the SOC is changed, the correction coefficient β when the root mean square (RMS) of the voltage drop amount is at minimum is used.

At step S104, the controller 200 determines whether or not the correction coefficient β specified at step S103 is the same as the correction coefficient β stored previously in the memory 200a. When the correction coefficient β specified at step S103 is the same as the correction coefficient β stored previously in the memory 200a, the present processing is ended. In other words, the correction coefficient β stored in the memory 200a is not changed. On the other hand, when the correction coefficient β specified at step S103 is different from the correction coefficient β stored previously in the memory 20a, the controller 200 proceeds to step S105.

At step S105, the controller 200 stores the correction coefficient β specified at step S103 in the memory 200a. The correction coefficient β stored newly in the memory 200a is used for calculating the voltage drop amount ΔV.

According to the present embodiment, the correction coefficient β suitable for the internal state (the state of the interface) of the cell 100 can be specified to improve the estimation accuracy of the voltage drop amount ΔV. In addition, when the correction coefficient β can be specified, the internal state of the cell 100 can be estimated. Since the correction coefficient β and the state of the interface have a correspondence, the specification of the correction coefficient β enables the estimation of the state of the interface. For example, when the correction coefficient β is reduced, it can be seen that a coating is newly formed inside the cell 100, and the degree of deterioration of the cell 100 can be estimated.

The invention claimed is:
1. An estimation apparatus comprising a controller which estimates an internal reaction of a secondary battery,
wherein the controller calculates a voltage drop amount due to an internal resistance of the secondary battery by using an expression (I):

$$\Delta V = \frac{RT}{\alpha \beta F} \operatorname{arcsinh}\left(\frac{-R_r I}{\frac{RT}{\alpha \beta F}}\right) - R_d I \qquad (I)$$

where ΔV represents the voltage drop amount, R represents a gas constant, T represents a temperature, α represents an oxidation reduction transfer coefficient (α=0.5) of an electrode, β represents a correction coefficient (0<β<1), F represents the Faraday constant, I represents a discharge current, Rr represents a component of a reaction resistance included in the internal resistance, and Rd represents a component of a direct-current resistance included in the internal resistance.

2. The estimation apparatus according to claim 1, further comprising a memory which stores the correction coefficient β,
  wherein the controller uses the correction coefficient β stored in the memory to calculate the voltage drop amount.

3. The estimation apparatus according to claim 1, further comprising a voltage sensor which detects a voltage of the secondary battery,
  wherein the controller calculates the correction coefficient β when the voltage drop amount calculated from the expression (I) is equal to a voltage drop amount obtained from a detection result of the voltage sensor.

4. The estimation apparatus according to claim 3, wherein the controller uses data indicating a correspondence between the correction coefficient β and an interface state within the secondary battery to specify the interface state associated with the calculated correction coefficient β.

5. The estimation apparatus according to claim 2, further comprising a voltage sensor which detects a voltage of the secondary battery,
  wherein the controller calculates the correction coefficient β when the voltage drop amount calculated from the expression (I) is equal to a voltage drop amount obtained from a detection result of the voltage sensor.

6. The estimation apparatus according to claim 5, wherein the controller uses data indicating a correspondence between the correction coefficient β and an interface state within the secondary battery to specify the interface state associated with the calculated correction coefficient β.

* * * * *